United States Patent [19]
Takeda et al.

[11] Patent Number: 5,340,999
[45] Date of Patent: Aug. 23, 1994

[54] INSULATED GATE THIN FILM TRANSISTOR WITH AMORPHOUS OR MICROCRYSTALLINE SEMICONDUCTOR FILM

[75] Inventors: Makoto Takeda, Tenri; Tadanori Hishida, Kashihara, both of Japan

[73] Assignee: Sharp Kabushiki Kaisha, Osaka, Japan

[21] Appl. No.: 968,453

[22] Filed: Oct. 29, 1992

Related U.S. Application Data

[63] Continuation of Ser. No. 333,732, Apr. 3, 1989, abandoned, which is a continuation of Ser. No. 467,667, Feb. 18, 1983, abandoned.

[30] Foreign Application Priority Data

Feb. 25, 1982 [JP] Japan ................................. 57-30219
Jan. 31, 1983 [JP] Japan ................................. 58-15748

[51] Int. Cl.$^5$ ................... H01L 27/01; H01L 27/13; H01L 29/78
[52] U.S. Cl. ........................ 257/66; 257/411
[58] Field of Search ............... 357/23.7; 257/57, 66, 257/324, 411

[56] References Cited

U.S. PATENT DOCUMENTS

| | | | |
|---|---|---|---|
| 3,191,061 | 6/1965 | Weimer | 357/4 X |
| 3,900,598 | 8/1975 | Hall et al. | 257/766 |
| 3,974,515 | 8/1976 | Ipri et al. | 357/23.7 OR |
| 4,065,781 | 12/1977 | Gutknecht | 357/4 X |
| 4,242,156 | 12/1980 | Peel | 357/54 X |
| 4,305,086 | 12/1981 | Khajezadeh | 357/54 OR |
| 4,335,391 | 6/1982 | Morris | 357/41 |
| 4,425,572 | 1/1984 | Takafuji et al. | 357/23 TF |
| 4,514,253 | 4/1985 | Minezaki | 357/237 |

FOREIGN PATENT DOCUMENTS 0204168 12/1982 Japan ................................. 357/23.7

OTHER PUBLICATIONS

"Composite Dielectric Layer" IBM Technical Disclosure Bulletin, vol. 14, No. 9, Feb. 1972, p. 2609.
"Amorphous-silicon thin-film metal-oxide-semiconductor transistors" H. Hayama and M. Matsumura, Appl. Phys. Lett. 36(9) May 1, 1980 pp. 754–755.
Sze, S. M., *Physics of Semiconductor Devices*, Wiley, 1981, p. 852.

*Primary Examiner*—Sara W. Crane

[57] ABSTRACT

An insulated gate thin film transistor (TFT) comprises first and second insulating films, and a semiconductor film disposed thereon. The first insulating film is prepared with anodization. The second insulating film is prepared with CVD or sputtering. The semiconductor film is amorphous, or microcrystalline prepared with glow discharge.

3 Claims, 2 Drawing Sheets

INSULATED GATE THIN FILM TRANSISTOR WITH AMORPHOUS OR MICROCRYSTALLINE SEMICONDUCTOR FILM

This application is a continuation of application Ser. No. 07/333,732 filed on Apr. 3, 1989, now abandoned; which was a continuation of application Ser. No. 06/467,667 filed on Feb. 18, 1983, now abandoned.

BACKGROUND OF THE INVENTION

The present invention relates to an insulated gate thin film transistor and, more particularly, to an insulated gate thin film transistor( referred to as "TFT" hereinafter) with an amorphous or microcrystalline semiconductor film.

FIG. 1 shows a sectional view of a conventional insulated gate thin film transistor(TFT).

The TFT of FIG. 1 comprises an insulating substrate 1, a gate electrode 2, a gate insulating film 3, a semiconductor film 4, a source electrode 5, a drain electrode 6.

The insulating substrate 1 is made of glass, ceramic, or crystal. The gate electrode 2 is made of Cr, Al, NiT or Au etc. The gate insulating film 3 is made of SiO, $SiO_2$, $Al_2O_3$, $Ta_2O_5$, $Y_2O_3$, $Si_3N_4$, or $MgF_2$ etc. The semiconductor film 4 is composed of CdS, CdSe, Te, or PbS etc. The source electrode 5 and the drain electrode 6 are made of Al, Au, Ni, Cr or In etc,. so that they are connected to the semiconductor film 4 in an ohmic contact.

When the above-constructed TFT is applied for driving a liquid crystal panel in a multiplex driving, the following features must be presented by the TFT: showing a high OFF resistance ($R_{off}$) to provide a sharp cutting operation; showing a low ON resistance $R_{on}$ to improve an ON-OFF ratio $R_{off}/R_{on}$; having a high switching speed; and being stable even after over a long period of time.

To satisfy the above requirements, the gate insulating film 3 in the TFT should have the following features:
1. a high resistance, free of any pin holes, so that good reliability is expected along with the ability to withstand high voltages;
2. a low mobile ion density;
3. a low interface level with a semiconductor film; and
4. a large field effect effect against the semiconductor film.

Although requirements 1 and 4 conflict with each other, so that the conventional TFT cannot satisfy all the requirements, this could be achieved by anodization.

For example, sputtering or CVD cannot provide a thin film made of $SiO_2$, $Si_3N_4$ etc. below a thickness of 2000–3000 Å, free of pin holes. However, anodization can provide an insulating film in a thickness of several hundreds of Å, free of pin holes, in which the insulating films can withstand a high voltage. When a voltage to be applied to the gate electrode is made constant, the field effect against the semiconductor film surface is proportional to the dielectric constants of the insulating films and inversely proportional to the thickness of the films. Thus, anodization can provide a thin film for providing a high field effect. Unfortunately, according to a conventional method, the anodized thin film may be damaged when a semiconductor film is disposed over the thin film, whereby the dielectric property of the thin film is degraded and is not suitable for the gate insulating film for the TFT. Since the preparation of the semiconductor film must occur after the preparation of the gate insulating film in view of the TFT structure, the degradation of the dielectric property cannot be avoided.

SUMMARY OF THE INVENTION

Accordingly, it is an object of the present invention to provide an improved insulated gate thin film transistor (TFT).

It is another object of the present invention to provide an improved TFT for satisfying all the requirements 1-4 so that the TFT is expected to be of high reliability and good quality.

Briefly described, in accordance with the present invention, an insulated gate thin film transistor (TFT) comprises a double gate insulating film and an amorphous silicon semiconductor film or a microcrystalline silicon semiconductor film. Preferably, the semiconductor film is grown with glow discharge. The microcrystalline film has microcrystal containing grains having a diameter of about several tens to several hundreds Å.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 2:
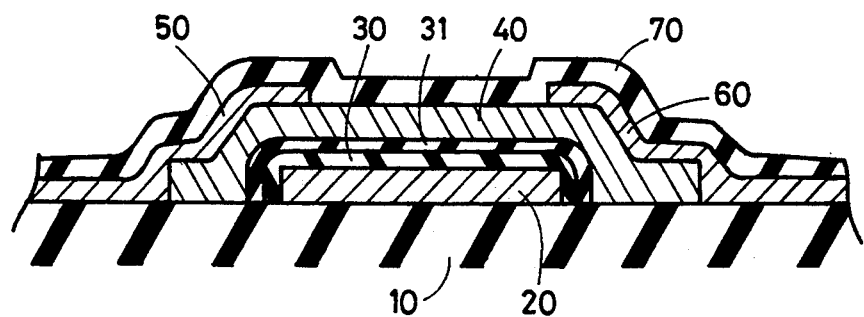
FIG. 2 shows a cross sectional view of TFT according to the present invention.

FIG. 2 shows an insulated gate thin film transistor (TFT) according to the present invention.

The TFT of FIG. 2 comprises an insulating substrate 10, a gate electrode 20, a first insulating filth 30, a second insulating film 31, an amorphous silicon film 40, a source electrode 50, a drain electrode 60, and a protecting film 70.

The substrate 10 is made of glass, ceramic or crystal etc. A Ta layer is coated on the surface of the substrate 10. The Ta film is dipped 1 in a solution containing ammonium tartrate to anodize an oxide film made of $Ta_2O_5$ in a thickness of about 1000 Å by applying a constant voltage of about 65 V. This Ta layer is used as the gate electrode 20. The. $Ta_2O_5$ film is used as the first insulating film 30.

On the first insulating film 30, the second insulating film 31 made of $Si_3N_4$ etc. is prepared in a thickness of about 1000 Å by CVD or sputtering. In place of $Si_3N_4$, SiO, $SiO_2$, $Y_2O_3$, $Al_2O_3$, and $MgF_2$ etc. can be used. The second insulating film 31 protects the first insulating film 30. The first and second insulating films 30 and 31 form a double insulating gate film.

The semiconductor film 40 is composed of amorphous silicon produced with glow discharge in a thickness of about 3000 Å. The source electrode 50 and the drain electrode 60 are both made of Al evaporated in a thickness of about 3000 Å.

The protecting film 70 is made of $Si_3N_4$ in a thickness of about 3000 Å with CVD to coat the semiconductor film 40. While the protecting film 70 can protect the semiconductor film 40, it serves to make the rear surface of the semiconductor film 40 in a depletion layer to reduce a leak current in an OFF state of the TFT so as to improve the TFT property.

Figure 1:
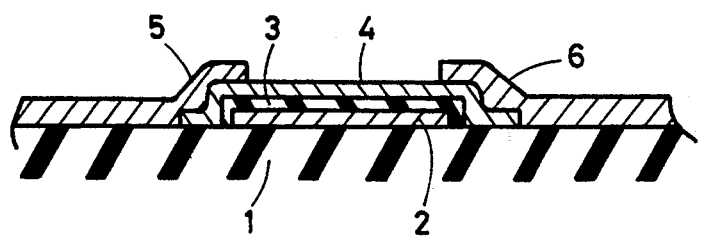
FIG. 1 shows a cross sectional view of a conventional TFT.

As the specific dielectric constants of $Si_3N_4$ and $Ta_2O_5$ are about 6.4 and 26.0, respectively, a single gate insulating film made of $Si_3N_4$ as described with reference to FIG. 1 must be about 1250 Å where pin hole problems occur, resulting in the degradation of the dielectric property.

According to the present invention, the first insulating film 30 made of $Ta_2O_5$ and the second insulating film 31 made of $Si_3N_4$ are combined. The $Ta_2O_5$ film is free of pin holes providing a high dielectric property. As the second insulating film 31 covers the first insulating film 30, the second insulating film 31 can protect the first insulating film 30 when subjecting the semiconductor film 40 to glow discharge. The first insulating film 30 is thus prevented from being damaged and the high dielectric property of the first dielectric film 30 can thus be maintained. Since the semiconductor film 40 is composed of an amorphous semiconductor any deviation from stoichiometric requirements is avoided. The amorphous film is featured in that it provides a high energy gap, and that it contains a small number of intrinsic carriers, which is suitable for the TFT.

As the gate electrode 20 is made of Ta, the work function of Ta is larger than Al etc., so that, in an N-channel TFT, a pinch off voltage is made positive to provide a normal off TFT. Hence, an OFF resistance of a, at the time when the gate voltage is zero, is made high, which is suitable for a liquid crystal matrix display.

The protecting film 70 can isolate the semiconductor film 40 from the surrounding. It reduces the curving in energy bands at the semiconductor film surface confronting the gate insulator 31 and the curving in energy band at its opposing surface confronting the protecting film 70 to stabilize the quality of the TFT and improve the OFF resistance.

If the TFT is disposed within a liquid crystal cell, the protecting film 70 can isolate the TFT from a liquid crystal mixture layer to prolong the life time of the TFT.

Further, the protecting film 70 serves to protect the TFT when a metal film is coated over the TFT for blocking the active layers of the TFT from light. When the metal film is coated over the film 70 to further cover the acting layers of the TFT, the film 70 can avoid the problem that a leakage current reduces the OFF resistance of the TFT.

Figure 3:
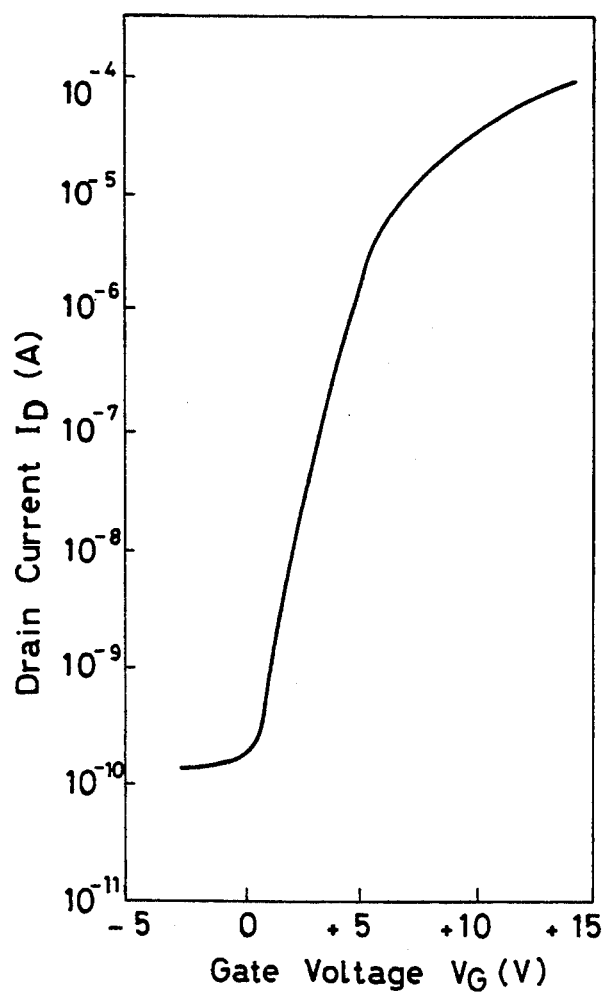
FIGS. 3 and 4 show a graph representing the relationship between a drain current and a gate voltage in the TFT of the present invention.

FIG. 3 shows a graph representing the relation of the drain current v. the gate voltage when a source-drain voltage is set to be about 10 V. The data of FIG. 3 are measured when, in a channel between the source electrode 50 and the drain electrode 60, the channel length is about 40 $\mu m$ and the channel width is about 2000 $\mu m$. The graph of FIG. 3 shows that an ON/OFF ratio (against the drain current) is in the several tens of thousands in a range of about 0-5 V. and in the several hundreds of thousands in a range of about 0-10 V.

In place of the amorphous silicon film 40, a microcrystaline silicon film can be used. Such a film is produced with glow discharge in a thickness of about 3000 Å. In this case, a $SiH_4$ gas diluted with much hydrogen, for example, in a ratio of $SiH_4/(SiH_4+H_2)=0.03$ is decomposed.

The microcrystalline film 40 is composed of microcrystals. Otherwise, it is composed of amorphous silicon film partially containing microcrystals. The grains of the microcrystal are typically in a range of several tens to several hundreds of Å to provide high mobility rather than the proper amorphous film.

Using a $SiH_4$ gas diluted with $H_2$, glow discharge provides a layer comprising an amorphous silicon, and microcrystals discretely located with grains of several tens to several hundreds of Å, typically, about 50-100 Å.

Thereafter, the. microcrystals are grown, if required to thereby form a polycrystal.

Figure 4:
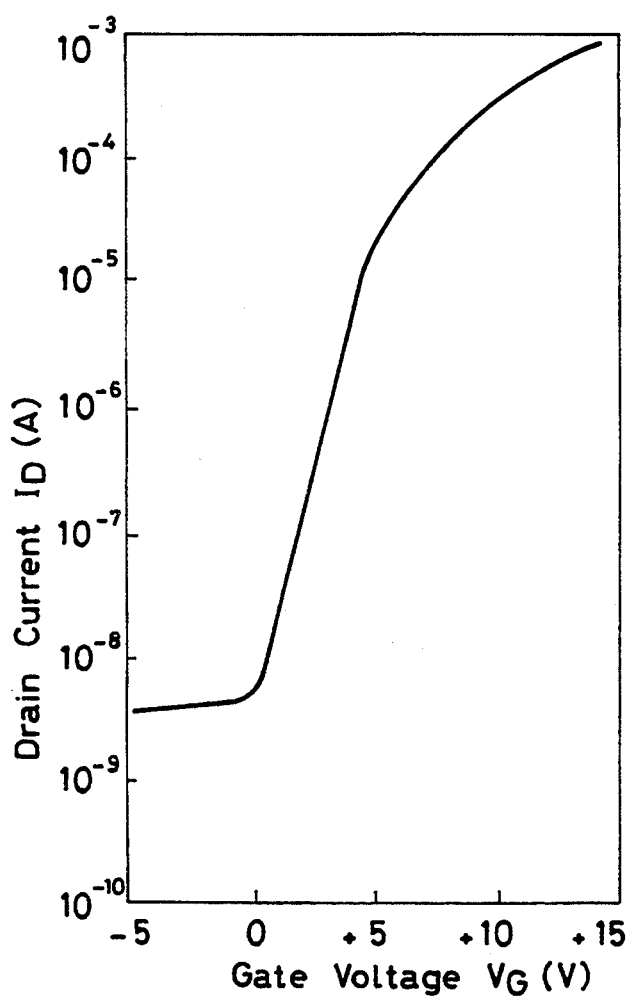

FIG. 4 shows a graph representing the relation of the drain current v. the gate voltage. The data of FIG. 4 are measured under the same conditions as in FIG. 3. The graph of FIG. 4 shows that the ON/OFF ratio of FIG. 4 is more than several thousands in a region of about 0-10 V. and about several hundreds of thousands in a region of about 0-10 V.

While only certain embodiments of the present invention have been described, it will be apparent to those skilled in the art that various changes and modifications may be made therein without departing from the spirit and scope of the present invention as claimed.

What is claimed is:

1. An insulated gate thin film transistor comprising:
   an insulating substrate;
   a gate electrode disposed on said insulating substrate;
   a first insulating film disposed directly on and completely covering the gate electrode, said first insulating film being an anodized portion made from said gate electrode;
   a second insulating film disposed directly on and completely covering the first insulating film, said first and second insulating films functioning as a double insulating film for said gate electrode;
   a silicon semiconductor film being a microcrystalline semiconductor film disposed over the insulating film;
   a source electrode and a drain electrode disposed on said semiconductor film; and
   a protecting film coated on said source and drain electrodes and on exposed portions on said semiconductor film, wherein the source electrode and the drain electrode partially overlap the gate electrode through the first insulating film, the second insulating film and the semiconductor film therebetween wherein said second insulating film is made of silicon nitride, the thickness of the silicon nitride film being equal to 1000 Å or more and less than 2000 Å.

2. The insulated gate thin film transistor of claim 1, wherein the microcrystalline film comprises a microcrystalline silicon film containing grains having a diameter of about several tens to several hundred Å.

3. The insulated gate thin film transistor of claim 2, wherein the first insulating film comprises a $Ta_2O_5$ film.

* * * * *